United States Patent
Merrill et al.

(10) Patent No.: US 6,512,544 B1
(45) Date of Patent: Jan. 28, 2003

(54) STORAGE PIXEL SENSOR AND ARRAY WITH COMPRESSION

(75) Inventors: Richard B. Merrill, Woodside, CA (US); Richard F. Lyon, Los Altos, CA (US)

(73) Assignee: Foveon, Inc., Santa Clara, CA (US)

( * ) Notice: Subject to any disclaimer, the term of this patent is extended or adjusted under 35 U.S.C. 154(b) by 0 days.

(21) Appl. No.: 09/098,688

(22) Filed: Jun. 17, 1998

(51) Int. Cl.[7] .......................... H04N 3/14; H04N 5/335; H01L 27/10; H01L 31/062; H01L 27/00

(52) U.S. Cl. ................... 348/302; 348/297; 348/298; 348/299; 348/304; 348/314; 257/291; 257/292; 250/208.1

(58) Field of Search ................ 348/299, 297, 348/298, 304, 302, 314, 294; 257/204, 277, 291, 292; 250/208.1

(56) References Cited

U.S. PATENT DOCUMENTS

| | | | | |
|---|---|---|---|---|
| 3,866,067 A | * | 2/1975 | Amelio | 327/514 |
| 3,934,161 A | | 1/1976 | Caywood | 307/311 |
| 3,988,619 A | | 10/1976 | Malaviya et al. | 307/311 |
| 4,363,963 A | | 12/1982 | Ando | 250/211 |
| 4,473,836 A | | 9/1984 | Chamberlain | 357/30 |
| 4,626,915 A | | 12/1986 | Takatsu | 358/213 |
| 4,654,714 A | | 3/1987 | Hurst, Jr. et al. | 358/213 |
| 4,680,489 A | * | 7/1987 | Stetson | 327/543 |
| 4,734,776 A | | 3/1988 | Wang et al. | 358/213.31 |
| 4,742,238 A | | 5/1988 | Sato | 250/578 |
| 4,809,075 A | | 2/1989 | Akimoto et al. | 358/213.18 |
| 4,839,735 A | | 6/1989 | Kyomasu et al. | 358/213.31 |
| 4,845,553 A | | 7/1989 | Konomura et al. | 358/98 |
| 4,875,091 A | | 10/1989 | Yamada et al. | 358/42 |

(List continued on next page.)

FOREIGN PATENT DOCUMENTS

| | | | | |
|---|---|---|---|---|
| EP | 0777379 | | 6/1997 | H04N/3/15 |
| EP | 0 854 516 A2 | | 1/1998 | H01L/27/146 |
| EP | 0 854 516 A3 | | 1/1998 | H01L/27/146 |
| JP | 06/133320 | | 5/1994 | H04N/9/09 |
| WO | WO 99/66560 | | 12/1999 | H01L/27/144 |

OTHER PUBLICATIONS

S. M. Sze, *Physics of Semiconductor Devices*, pp. 526–533, Wiley–Interscience, 1969.

(List continued on next page.)

*Primary Examiner*—Wendy R. Garber
*Assistant Examiner*—John M. Villecco
(74) *Attorney, Agent, or Firm*—Sierra Patent Group, Ltd.

(57) ABSTRACT

A storage pixel sensor disposed on a semiconductor substrate comprises a photosensor. At least one nonlinear capacitive element is coupled to the photosensor. At least one nonlinear capacitive element is arranged to have a compressive photocharge-to-voltage gain function. An amplifier has an input coupled to the nonlinear capacitor and an output. Other, non-capacitive elements may be employed to produce a compressive photo-charge-to-voltage gain having at least one breakpoint.

18 Claims, 9 Drawing Sheets

U.S. PATENT DOCUMENTS

| | | | | |
|---|---|---|---|---|
| 4,901,129 | A | 2/1990 | Hynecek | 357/30 |
| 4,942,473 | A | 7/1990 | Zeevi et al. | 358/213.26 |
| 5,014,107 | A | 5/1991 | Vora | 357/44 |
| 5,021,853 | A | 6/1991 | Mistry | 357/23.13 |
| 5,055,418 | A | 10/1991 | Vora | 437/31 |
| 5,117,292 | A | 5/1992 | Matsunaga | 358/213.19 |
| 5,161,024 | A | 11/1992 | Oishi | 358/213.24 |
| 5,241,575 | A * | 8/1993 | Miyatake et al. | 377/60 |
| 5,276,521 | A | 1/1994 | Mori | 358/213.31 |
| 5,289,023 | A * | 2/1994 | Mead | 257/291 |
| 5,317,174 | A | 5/1994 | Hynecek | 257/222 |
| 5,335,015 | A | 8/1994 | Copper et al. | 348/302 |
| 5,341,008 | A | 8/1994 | Hynecek | 257/231 |
| 5,396,289 | A | 3/1995 | Nakamura | 348/294 |
| 5,414,464 | A | 5/1995 | Sasaki | 348/222 |
| 5,414,683 | A | 5/1995 | Tani | 36/47 |
| 5,424,223 | A | 6/1995 | Hynecek | 437/3 |
| 5,428,390 | A | 6/1995 | Copper et al. | 348/240 |
| 5,471,245 | A | 11/1995 | Cooper et al. | 348/302 |
| 5,541,402 | A | 7/1996 | Ackland et al. | 250/208.1 |
| 5,541,654 | A | 7/1996 | Roberts | 348/301 |
| 5,547,881 | A | 8/1996 | Wang et al. | 437/24 |
| 5,572,074 | A | 11/1996 | Standley | 307/117 |
| 5,576,763 | A | 11/1996 | Ackland et al. | 348/308 |
| 5,589,423 | A | 12/1996 | White et al. | 437/228 |
| 5,625,210 | A | 4/1997 | Lee et al. | 257/292 |
| 5,631,704 | A | 5/1997 | Dickinson et al. | 348/308 |
| 5,705,441 | A | 1/1998 | Wang et al. | 438/384 |
| 5,712,682 | A | 1/1998 | Hannah | 348/255 |
| 5,729,287 | A * | 3/1998 | Morimoto | 348/314 |
| 5,739,562 | A | 4/1998 | Ackland et al. | 257/291 |
| 5,742,058 | A | 4/1998 | Pantigny et al. | 250/370.08 |
| 5,892,541 | A * | 4/1999 | Merrill | 348/302 |
| 5,903,021 | A * | 5/1999 | Lee et al. | 257/292 |
| 6,040,570 | A * | 3/2000 | Levine et al. | 250/208.1 |
| 6,043,525 | A * | 3/2000 | Chen | 257/292 |
| 6,175,383 | B1 * | 1/2001 | Yadid-Pecht et al. | 348/302 |
| 6,246,436 | B1 * | 6/2001 | Lin et al. | 348/308 |
| 6,369,853 | B1 * | 4/2002 | Merrill et al. | 250/208.1 |

OTHER PUBLICATIONS

B. Rössler, "Electrically Erasable and Reprogrammable Read–Only Memory Using the n–Channel SIMOS One–Transistor Cell", *IEEE Transactions on Electron Devices*, vol. ED–24, No. 5, pp. 606–610, May 1977.

C. Mead et al., "Scanners for Visualizing Activity of Analog VLSI Circuitry", *CNS Memo 11*, California Institute of Technology Computation and Neural Systems Program, pp. 1–29, Jul. 5, 1991.

O. Yadid–Pecht et al., "A Random Access Photodiode Array for Intelligent Image Capture", *IEEE Transactions on Electron Devices*, vol. 38. No. 8, pp. 1772–1780, Aug. 1991.

S. Mendis et al., "A 128×128 CMOS Active Pixel image Sensor for Highly Integrated Imaging Systems", *IEEE IEDM*, vol. 93, pp. 583–584, 1993 (no month).

E. Fossum, "Active Pixel Sensors: Are CCD's Dinosaurs?", *SPIE*, vol. 1900, pp. 2–14, Jul. 1993.

T. Delbrück et al., "Analog VLSI Adaptive, Logarithmic, Wide–Dynamic–Range Photoreceptor", *ISCAS, CNS Memo*, No. 30, pp. 1–24, Apr. 2, 1994.

A. Dickinson, "A 256×256 CMOS Active Pixel Image Sensor with Motion Detection", *1995 IEEE International Solid–State Circuits Conference, Digest of Technical Papers*, pp. 226–227, Feb. 16, 1995.

T. Delbrück et al., "Analog VLSI Phototransduction by continuous–time, adaptive, logarithmic photoreceptor circuits", *CNS Memo No. 30*, pp. 1–24, Apr. 2, 1996.

Y. Hagiwara, "High–Density and High–Quality Frame Transfer CCD Imager with Very Low Smear, Low Dark Current, and Very High Blue Sensitivity", *IEEE Transactions on Electron Devices*, vol. 43, No. 12, pp. 2122–2130, Dec. 1996.

T. Nomoto et al., "A 4M–Pixel CMD Image Sensor with Block and Skip Access Capability", *IEEE International Solid–State Circuits Conference* (ISSCC97), pp. 186–187 453, & Slide Supp. 142–143, 398. 1997 (no month).

A. Blanksby et al., "Noise Performance of a Color CMOS Photogate Image Sensor", *IEEE IEDM*, vol. 97, pp. 205–208, 1997 (no month).

Hon–Sum Wong, "CMOS Image Sensors—Recent Advances and Device Scaling Considerations", *IEEE IEDM*, vol. 97, pp. 201–204, 1997 (no month).

R. Panicacci et al. "1/4–Inch CMOS Active Pixel Sensor with Smart On–Chip Functions and Full Digital Interface, Part 1. Brief Introduction to CMOS Image Sensors", *Hot Chips IX*, pp. 41–54, Aug. 25–26, 1997.

S. Decker, "A Wide Dynamic Range CMOS Imager With Parallel On–Chip Analog–to–Digital Conversion", *Submitted to Dept. of Electrical Engineering and Computer Science, Massachusetts Institute of Technology*, pp. 1–205, Sep. 1997.

R. McGrath et al., "Current–Mediated, Current–Reset 768× 512 Active Pixel Sensor Array", *International Solid State Circuits Conference, Digest of Technical Papers*, pp. 182–183, Slide Supp. 138–139, 1997 (no month).

S. Decker et al., "A 256×256 CMOS Imaging Array with Wide Dynamic Range Pixels and Column–parallel Digital Output", *IEEE International Solid–State Circuits Conference*, p. 176, 1998 (no month).

A. El Gamal et al., "Modeling and Estimation of FPN Components in CMOS Image Sensors", *Proceedings of SPIE*, vol. 3301, pp. 168–177, Apr. 1998.

H. Wong et al. "CMOS Active Pixel Image Sensors Fabricated Using a 1.8–V, 0.25–$\mu$m CMOS Technology", *IEEE Transactions on Electron Devices*, vol. 45, No. 4, pp. 889–894, Apr. 1998.

Chye Huat Aw, et al. "A 128×128–Pixel Standard CMOS Image Sensor with Electronic Shutter" IEEE International Solid State Circuits Conference vol. 39 pp 180–181, 440 Feb. 1996.

R.M. Guidash, et al. "A 0.6 um CMOS Pinned Photodiode Color Imager Technology", IEDM pp. 927–929 1997.

A 640×512 CMOS Image Sensor with Ultrawide Dynamic Range Floating–Point Pixel–Level ADC, Yang, et al., IEEE Journal of Solid–State Circuits, vol. 34, No. 12, Dec. 1999, pp. 1821–1834.

CCD Image Sensor with Differential, Pyradmidal Output for Lossless Image Compression, Kerneny, Sabrina et al., 1991, IEEE 1991 Custom Inetegrated Circuits Conference.*

* cited by examiner

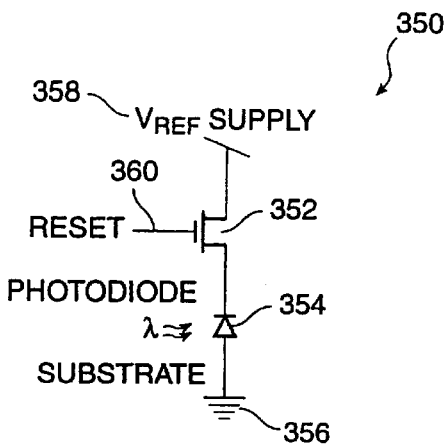
FIG. 13
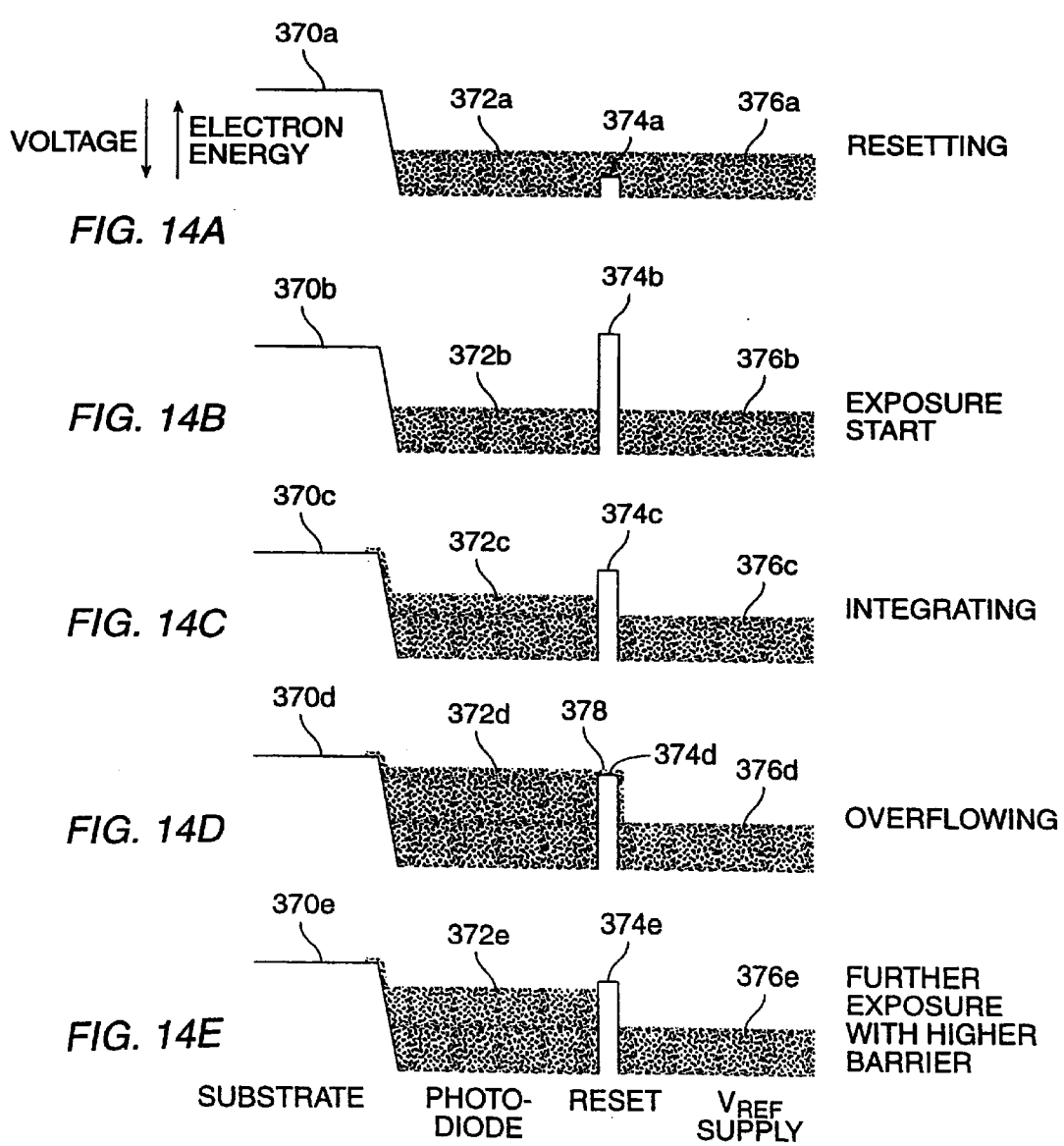
FIG. 14A  RESETTING
FIG. 14B  EXPOSURE START
FIG. 14C  INTEGRATING
FIG. 14D  OVERFLOWING
FIG. 14E  FURTHER EXPOSURE WITH HIGHER BARRIER

STORAGE PIXEL SENSOR AND ARRAY WITH COMPRESSION

BACKGROUND OF THE INVENTION

1. Field of the Invention

The present invention relates to image sensors and arrays of image sensors. More particularly, the present invention relates to compressive CMOS image sensors and image sensor arrays for still camera and other applications and to methods for operating those arrays.

2. The Prior Art

Integrated image sensors are known in the art. Such sensors have been fabricated from charge-coupled devices (CCDs) and as bipolar and MOS image sensors.

A problem encountered with prior-art imagers is a limitation on the dynamic range of images that can be captured by the array. Images that contain both low-light-level pixels and high-light-level pixels could be improved if the dynamic range of the imager could be increased.

In an active pixel sensor, the sensitivity of measuring charges generated by photons can be described as a charge-to-voltage gain. Typically, in a prior art active pixel sensor, the charge-to-voltage gain is accounted for by two factors. A first factor is the reciprocal of the capacitance of the charge accumulation node in the sensor where photocharge accumulates to change a potential (a reciprocal capacitance represents units of volts per coulomb). A second factor is the gain of the readout amplifier, typically less than one using a source follower. Voltage dependence of the photodiode capacitance and other capacitances, and nonlinearities of the readout amplifier transistor can make the gain vary with level, so that the overall transfer curve may be somewhat nonlinear. A nonlinearity in which higher light intensities give lower gains is said to be compressive. A significant degree of compressive nonlinearity can have a beneficial effect on the signal-to-noise ratio of the image at low light levels, and can thereby enhance the usable dynamic range of the imager.

It is therefore an object of the present invention to provide a pixel sensor and an array of pixel sensors that overcome some of the shortcomings of the prior art.

A further object of the present invention is to provide a storage pixel sensor and an imaging array of storage pixel sensors that includes image level compression.

Another object of the present invention is to provide a storage pixel sensor and an imaging array of storage pixel sensors that includes multi-breakpoint image level compression.

BRIEF DESCRIPTION OF THE INVENTION

A pixel sensor with compression according to the present invention comprises a photosensor coupled to a nonlinear capacitor arranged to have a compressive photocharge-to-voltage gain function. An amplifier having an input and an output is coupled to the nonlinear capacitor. According to one embodiment of the invention, the nonlinear capacitor comprises a MOS capacitor including a first plate formed from a channel region in a semiconductor substrate and having a diffusion terminal coupled to the photosensor, and a second plate formed from a gate material coupled to an adjustable voltage source. According to another embodiment of the invention, the compressive photocharge-to-voltage gain function of the pixel sensor has more than one breakpoint.

According to another embodiment of the invention, a pixel sensor according to the present invention disposed on a semiconductor substrate comprises a MOS capacitive element having a gate terminal coupled to an adjustable potential and a diffusion terminal. A photodiode has a first terminal coupled to a first potential (ground) and a second terminal coupled to the diffusion terminal of the MOS capacitive element. A semiconductor reset switch has a first terminal coupled to the second terminal of the photodiode and a second terminal coupled to a reset reference potential that reverse biases the photodiode. A semiconductor amplifier has an input coupled to the diffusion terminal of the MOS capacitive element and an output. The semiconductor reset switch has a control element coupled to a control circuit for selectively activating the semiconductor reset switch.

A first storage pixel sensor according to the present invention disposed on a semiconductor substrate comprises a MOS capacitive element having a gate terminal coupled to an adjustable potential and a diffusion terminal. A photodiode has a first terminal coupled to a first potential (ground) and a second terminal coupled to the diffusion terminal of the MOS capacitive element. A semiconductor reset switch has a first terminal coupled to the second terminal of the photodiode and a second terminal coupled to a reset reference potential that reverse biases the photodiode. A semiconductor transfer switch has a first terminal coupled to the diffusion terminal of the MOS capacitive element. A semiconductor amplifier has an input coupled to the second terminal of the semiconductor transfer switch and an output. A semiconductor row-select switch has a first terminal coupled to the output of the semiconductor amplifier, a second main terminal coupled to a column output line and a control element coupled to a row-select line. The semiconductor reset switch and the semiconductor transfer switch each have a control element coupled to a control circuit for selectively activating the semiconductor reset switch and the semiconductor transfer switch.

A second storage pixel sensor according to the present invention disposed on a semiconductor substrate comprises a MOS capacitive storage element having a gate terminal coupled to an adjustable potential and a diffusion terminal. A photodiode has a first terminal coupled to a first potential (ground) and a second terminal. A semiconductor reset switch has a first terminal coupled to the second terminal of the photodiode and a second terminal coupled to a reset reference potential that reverse biases the photodiode. A semiconductor transfer switch has a first terminal coupled to the second terminal of the photodiode and a second terminal coupled to the diffusion terminal of the MOS capacitive storage element. A semiconductor amplifier has an input coupled to the diffusion terminal of the MOS capacitive storage element and an output. A semiconductor row-select switch has a first terminal coupled to the output of the semiconductor amplifier, a second main terminal coupled to a column output line and a control element coupled to a row-select line. The semiconductor reset switch and the semiconductor transfer switch each have a control element coupled to a control circuit for selectively activating the semiconductor reset switch and the semiconductor transfer switch.

In all of the embodiments of the present invention, the adjustable potential to which the gate terminal of the MOS capacitive element is coupled is capable of supplying between about 1 and 3 volts. Depending on the process technology, higher voltages may be used as well.

According to presently preferred storage pixel embodiments of the invention, a light shield is disposed over portions of the semiconductor substrate including the storage node and the connection of the storage switch to the amplifier.

In addition, means are preferably provided for preventing substantially all minority carriers generated in the semiconductor substrate from entering the storage node.

BRIEF DESCRIPTION OF THE DRAWING FIGURES

Figure 5:
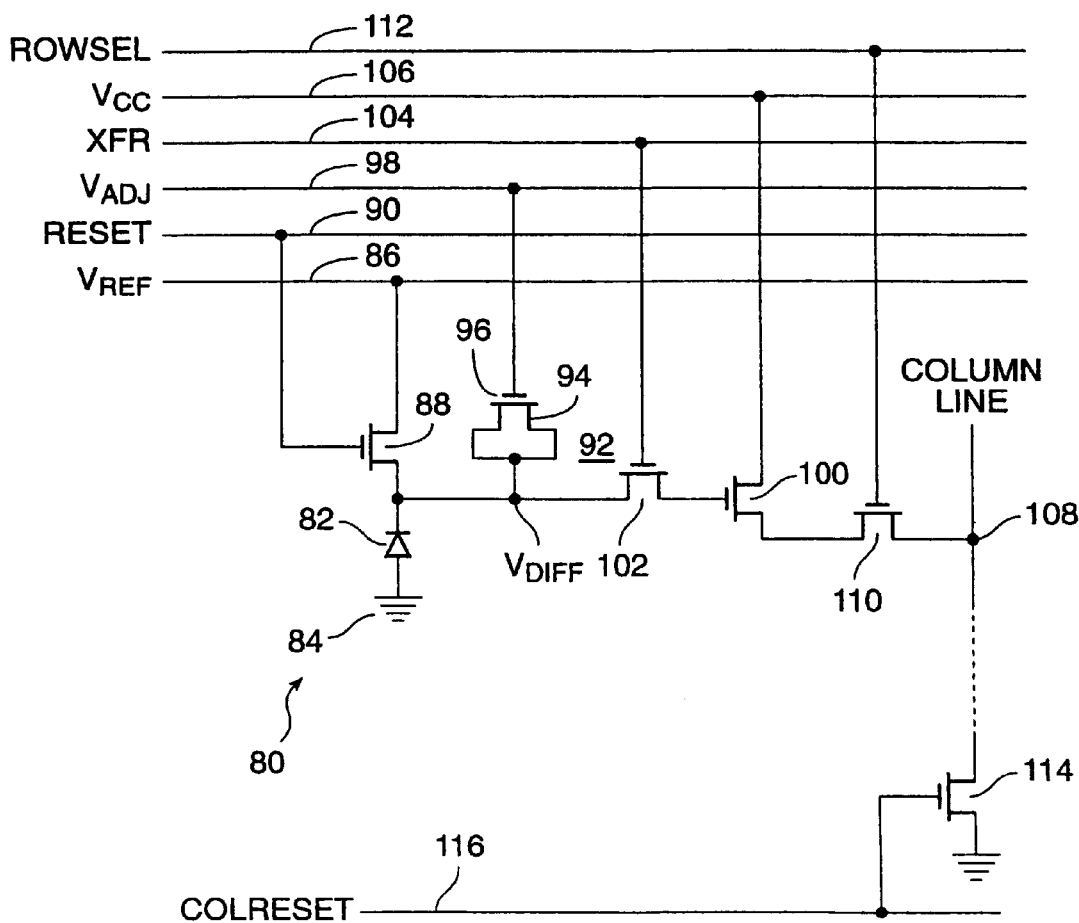
FIG. 5 is a schematic diagram of a first embodiment of a storage pixel sensor with compression according to the present invention.
Figure 11A:
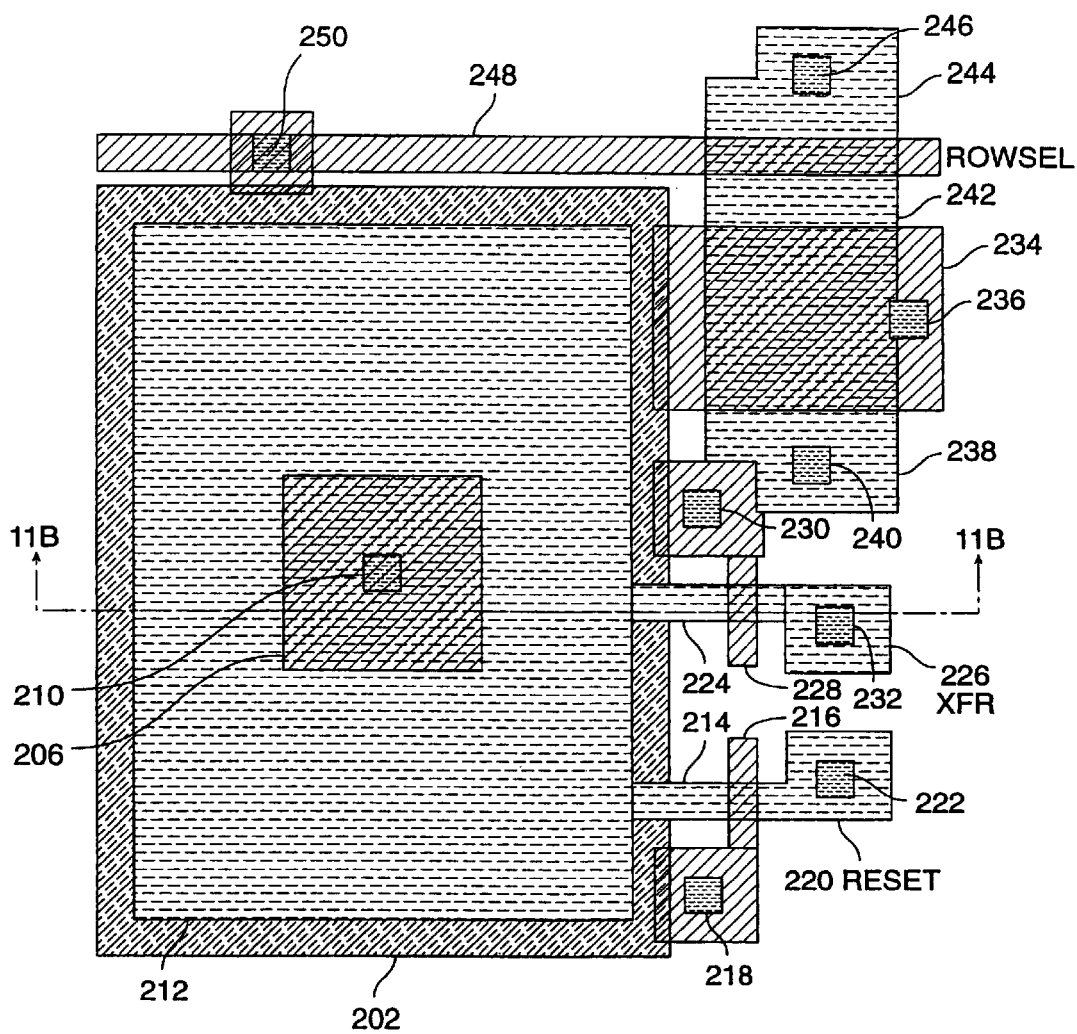
Figure 11B:
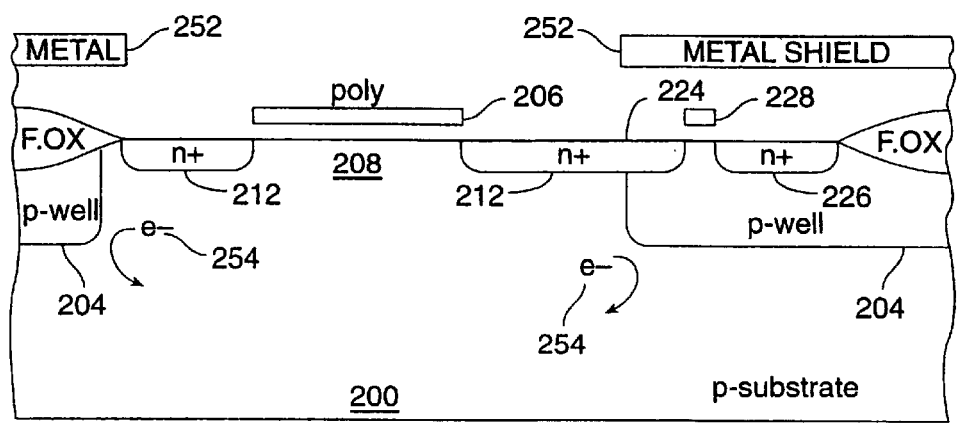

FIGS. 11a and 11b, respectively, are top and cross-sectional views of a typical layout for the storage pixel of FIG. 5.

Figure 6:
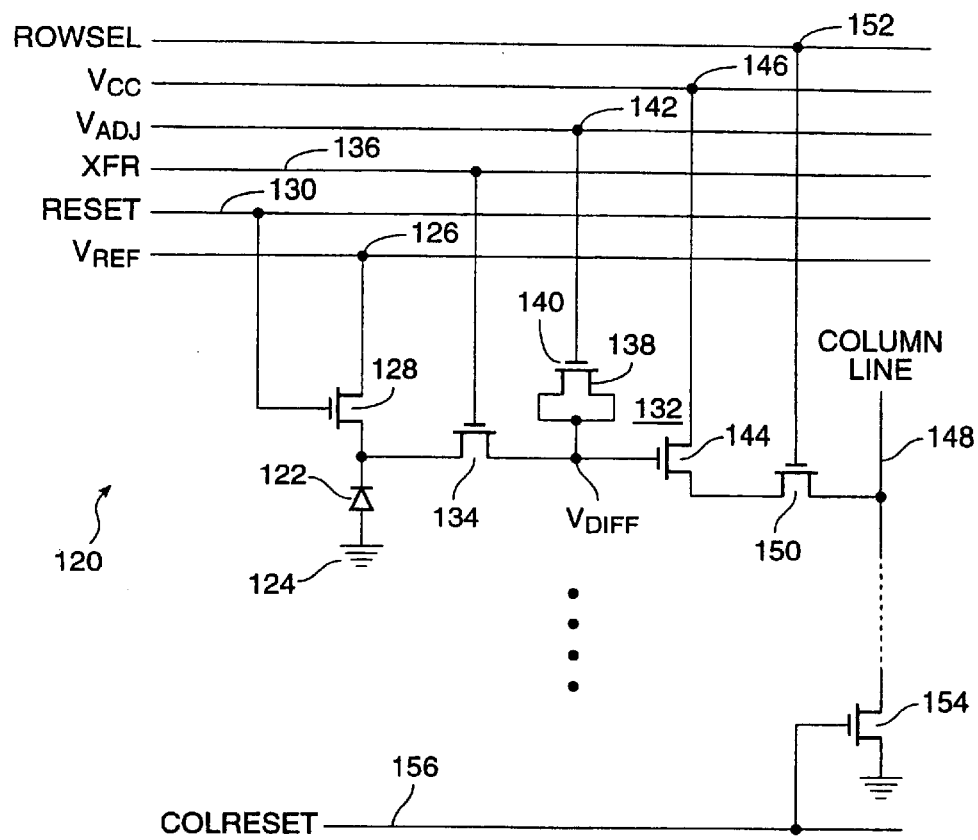
FIG. 6 is a schematic diagram of a second embodiment of a storage pixel sensor with compression according to the present invention.
Figure 12A:
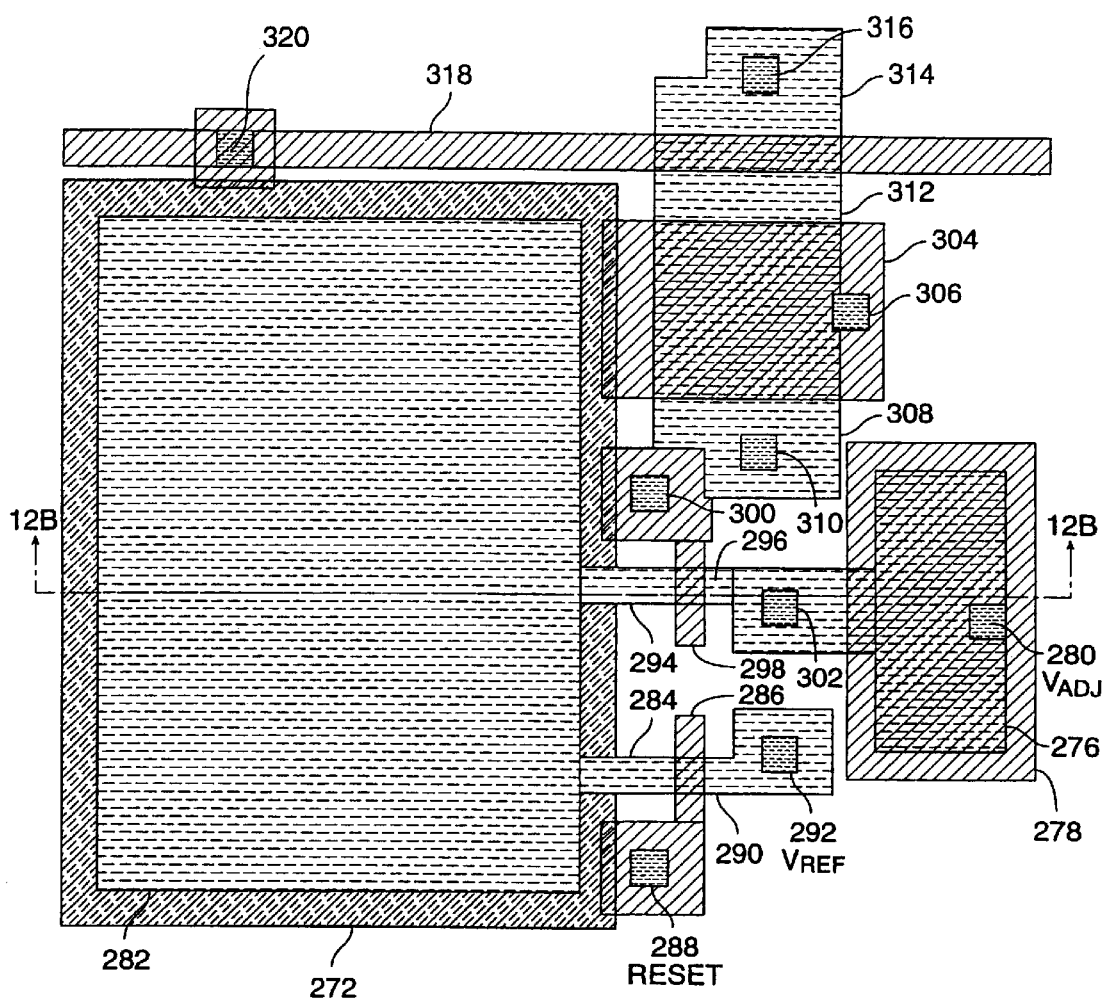
Figure 12B:
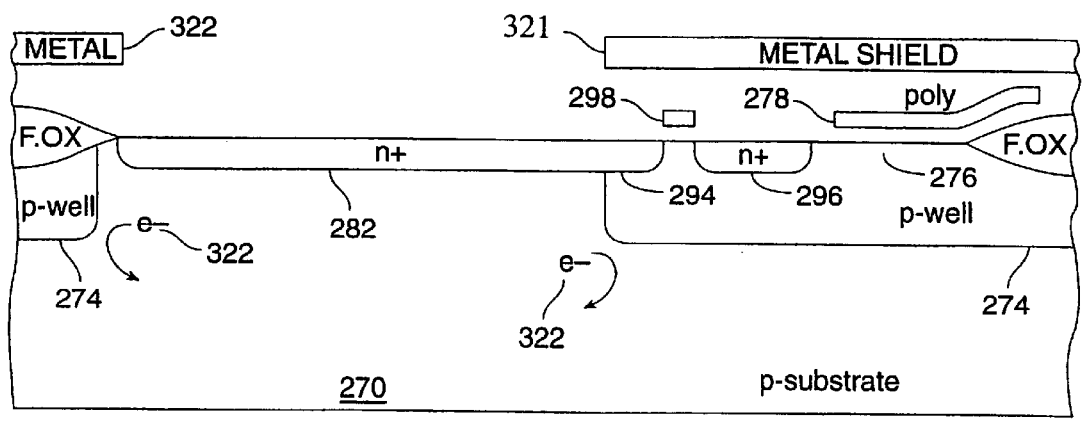

FIGS. 12a and 12b, respectively, are top and cross-sectional views of a typical layout for the storage pixel of FIG. 6.

FIG. 13 is a simplified schematic diagram of a pixel sensor illustrating the overflow barrier breakpoint method of the present invention.

FIGS. 14a through 14e are energy diagrams of the pixel sensor of FIG. 13, further illustrating the overflow barrier breakpoint method of the present invention.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
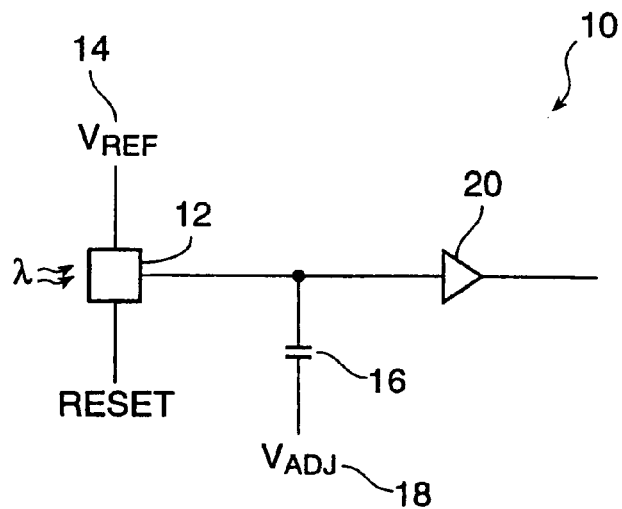
FIG. 1 is a simplified schematic diagram of a pixel sensor with compression according to the present invention.

Referring first to FIG. 1, a simplified schematic diagram shows a pixel sensor 10 with compression according to the present invention. Pixel sensor 10 comprises a photosensor 12 with initialization means 12 referenced to a voltage shown as Vref 14. The photosensor 12 is coupled to a nonlinear capacitor 16 biased by a voltage Vadj at reference numeral 18. The photosensor 12 and nonlinear capacitor 16 are coupled to an amplifier 20. Nonlinear capacitor 16 has a compressive photocharge-to-voltage gain function. According to one aspect of the present invention that will be disclosed herein, the photocharge-to-voltage compression function of the capacitor may be used in conjunction with additional nonlinearities to provide a compression function that is closer to a power-law compression curve.

Figure 2:
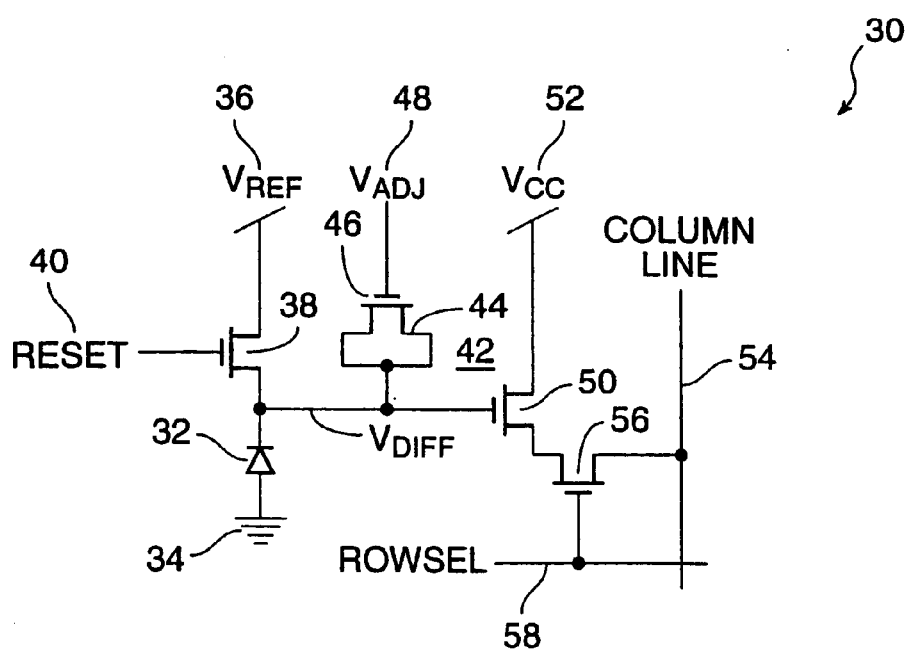
FIG. 2 is a schematic diagram of an embodiment of a pixel sensor with compression according to the present invention.

Referring now to FIG. 2, a schematic diagram is presented of a pixel sensor with a single-break compressive photocharge-to-voltage gain function according to the present invention. Pixel sensor 30 employs a photodiode 32 as the photosensor element although other photosensor elements could be employed. Photodiode 32 has its anode coupled to a fixed voltage source shown as ground at reference numeral 34, and its cathode connectable to a reference voltage 36 through a reset switch 38. Reset switch 38 is shown as an N-Channel MOS transistor having its source coupled to the cathode of photodiode 32, its drain coupled to reference voltage 36, and its gate coupled to a a RESET signal line 40.

Nonlinear capacitor 42 is a MOS capacitor having a first plate 44 comprising a channel region with a diffusion terminal in a semiconductor substrate and a second plate 46 comprising a gate region disposed over the channel region as is known in the art. The first plate 44 of nonlinear capacitor 42 is coupled to the cathode of the photodiode 32 and its second plate 46 is coupled to a voltage source Vadj at reference numeral 48. According to a presently preferred embodiment of the invention, the voltage Vadj for all the pixels in an array is preferably coupled to a single adjustable voltage source capable of supplying between about 1 and 3 volts. The diffusion terminal of the first plate of the capacitor may be the same diffusion area as the photodiode cathode, or a separate diffusion region coupled to the photodiode cathode.

Use of such a MOS capacitor, known as a varactor, exploits the fact that the gate capacitance of such a device is small when the Vgs is below threshold and the channel is in depletion and large when the Vgs is above threshold and the channel is in inversion. The voltage Vadj is chosen to set the threshold point with respect to the accumulating charge and thereby fix the compression point of the device. In a presently contemplated embodiment of the invention, the adjustable voltage source may be factory set to adjust the break point in the photocharge-to-voltage gain ratio of the device.

Amplifier 50 is coupled to the cathode of photodiode 32 and the first plate of nonlinear capacitor 42. In the embodiment of FIG. 2, amplifier 50 is an N-Channel MOS transistor having its gate coupled to the cathode of photodiode 32 and the first plate 44 of nonlinear capacitor 42 and its drain coupled to voltage source Vcc at reference numeral 52. The source of the N-Channel MOS transistor comprising amplifier 50 is coupled to column line 54 through a row select switch 56, shown as an N-Channel MOS transistor. The gate of row-select switch 56 is driven by a ROWSEL signal on row-select line 58.

Figure 3A:
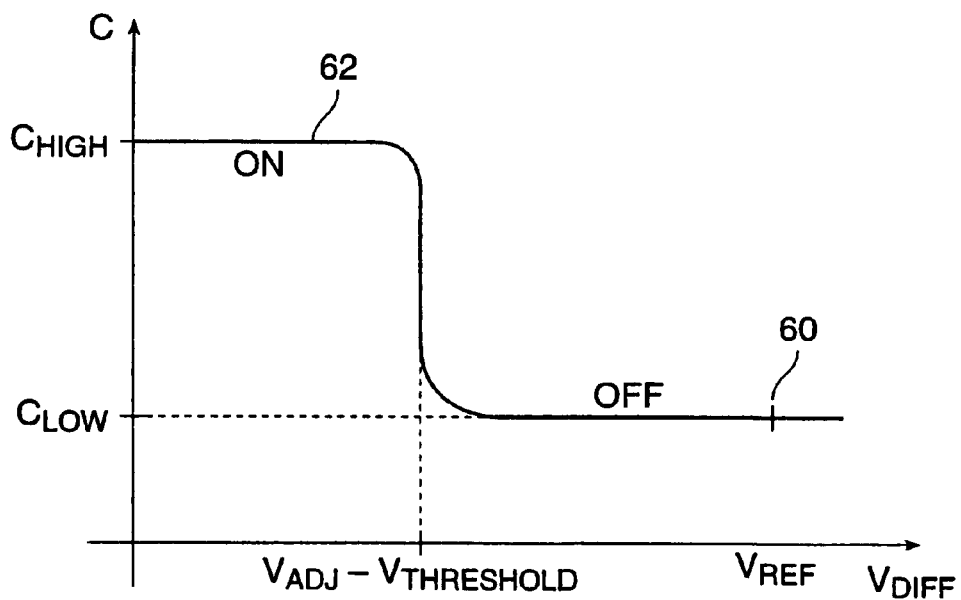
FIGS. 3a and 3b are curves illustrating the single-breakpoint photocharge-to-voltage compression feature of the present invention.
Figure 3B:
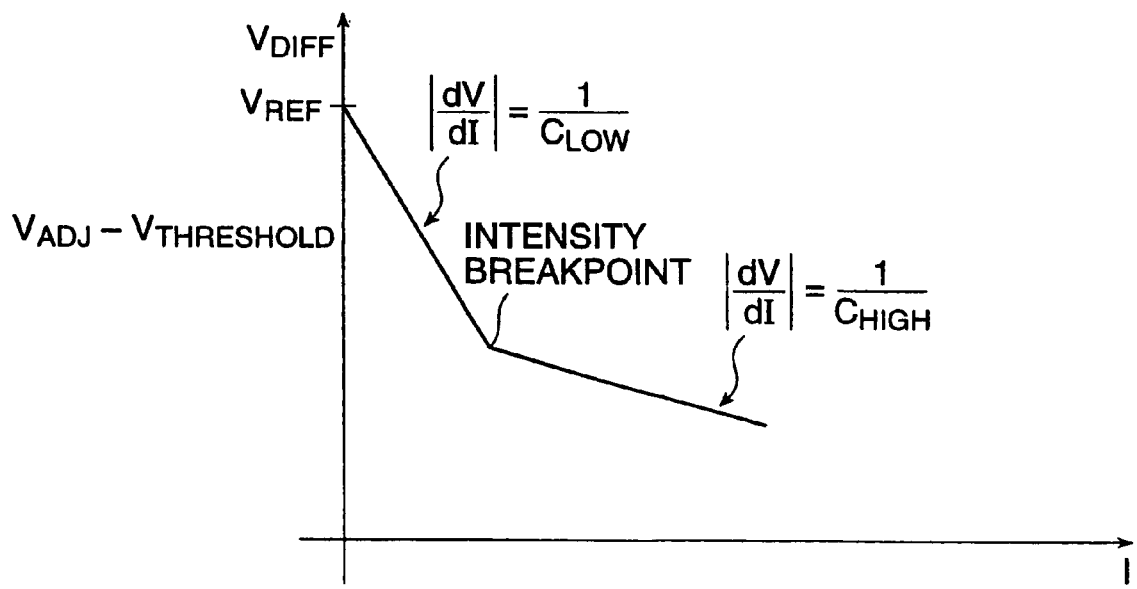

The operation of the nonlinear capacitor 42 is illustrated by FIGS. 3a and 3b. FIG. 3a is a plot of capacitance of MOS capacitor 42 as a function of the voltage Vdiff (equal to Vadj minus Vgs) on the diffusion terminal, the first plate 44 of the MOS capacitor 42. When the pixel sensor is reset to Vref by turning on reset switch 38, Vdiff is set equal to Vref as shown at reference numeral 60. At this point, the MOS capacitor device is "off" and the capacitance value of the capacitor is low, at the value Clow. As the integration period of the pixel sensor progresses and negative charge is accumulated, the voltage Vdiff decreases from Vref until the voltage from the second plate to the first plate (Vgs, or Vadj minus Vdiff) reaches a value such that the threshold voltage of the MOS device comprising capacitor 42 is exceeded. The MOS device turns on and its capacitance rapidly increases to the value Chigh as shown at reference numeral 62 in FIG. 3a.

FIG. 3b is a plot of Vdiff as a function of integrated photocurrent in the environment of the MOS capacitor 42. The plot of FIG. 3b is an example of a single-break photocharge-to-voltage gain compression according to the present invention. When the integration period begins, the capacitance value is Clow and the slope |dV/dI| of the V-I curve is equal to the reciprocal of Clow. When the voltage across capacitor 42 passes its threshold, it rapidly changes capacitance to the value Chigh and the slope |dV/dI| is then equal to the reciprocal of Chigh. The knee of the V-I curve is the intensity breakpoint in FIG. 3b. Persons of ordinary skill in the art will recognize that changing the voltage Vadj at the gate plate of the MOS capacitor will vary the point at which the MOS capacitor turns on, and therefore the point at which the slope |dV/dI| changes.

Figure 4:
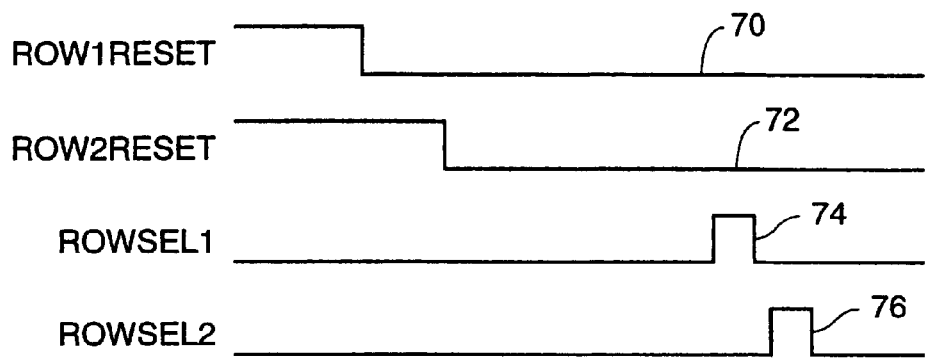
FIG. 4 is a timing diagram showing the presently preferred timing of the signals used to operate an array of the pixel sensor of FIG. 2.

Referring now to FIG. 4, a timing diagram is presented showing the presently preferred operation of an array of pixel sensors of the type depicted in FIG. 2. To avoid overcomplicating the timing diagram, the timing for two illustrative rows of an array are depicted in the figure. From FIG. 4, persons of ordinary skill in the art will readily be able to provide proper timing signals for arrays of arbitrary size.

The signal ROW1RESET at reference numeral 70 is presented to the gates of the reset switches (reference numeral 38 of FIG. 2) of all of the pixel sensors in the first row of the array. The signal 70 is initially high to reset each pixel in the first row of the array. When the signal 70 goes low, photocurrent integration begins for all of the pixels in the first row of the array.

The signal ROW2RESET at reference numeral 72 is presented to the gates of the reset switches (reference numeral 38 of FIG. 2) of all of the pixel sensors in the second row of the array. As with signal 70, the signal 72 is initially high to reset each pixel in the second row of the array. When the signal 72 goes low, integration begins for all of the pixels in the second row of the array.

The signal ROW1ENABLE 74 is presented on the ROWSEL line (reference numeral 58 of FIG. 1) associated with the first row in the array. The signal 74 is used to transfer the pixel outputs of the pixel sensors in the first row of the array to the column lines of the array for readout. The integration period for the first row of the array is determined by the time between the falling edge of signal 70 and the rising edge of signal 74. Similarly, the signal ROW2ENABLE 76 is presented on the ROWSEL line (reference numeral 58 of FIG. 2) associated with the second row in the array. The signal 76 is used to transfer the pixel outputs of the pixel sensors in the second row of the array to the column lines of the array for readout. The integration period for the second row of the array is determined by the time between the falling edge of signal 72 and the rising edge of signal 76.

Those of ordinary skill in the art will observe that the falling edge of the ROW2RESET signal 72 is offset from and occurs later in time than the falling edge of the ROW1RESET signal 70. The ROW1ENABLE and ROW2ENABLE signals are similarly offset. The offsets are repeated for the row enable signals for subsequent rows in the array and are used because only one row at a time may be read onto the column lines. The reset signals are offset to compensate for the row enable signal offsets to ensure that the pixel integration times are equal in all rows in the array.

Referring now to FIG. 5, a schematic diagram illustrates a first embodiment of a storage pixel 80 with intensity compression according to the present invention. FIG. 5 shows pixel 80 in the environment of an array of such pixels. Storage pixel sensor 80 comprises a photodiode 82 having its anode coupled to a fixed voltage potential 84 (shown in FIG. 5 as ground). The cathode of photodiode 82 connectable to a reference potential Vref 86 via a reset switch 88, shown in FIG. 5 as an N-Channel MOS transistor, so that the photodiode 82 is reverse biased. The gate of the N-Channel MOS transistor forming reset switch 88 is driven by a RESET signal on Reset line 90.

The cathode of photodiode 82 is also coupled to a nonlinear capacitor. The nonlinear capacitor has a compressive photocharge-to-voltage gain function. According to a presently preferred embodiment of the invention, the nonlinear capacitor comprises an MOS storage capacitor 92 having a first plate 94 comprising a channel region with a diffusion terminal coupled to the cathode of photodiode 82 and a second plate 96 comprising a polysilicon gate coupled to an adjustable voltage potential Vadj on line 98. In an array of storage pixel sensors 80 according to the present invention, the Vadj potential for all of the pixels in the array will be preferably coupled to a single adjustable voltage source capable of supplying a DC voltage between about 1 and 3 volts. The operating characteristics, particularly the photocharge-to-voltage gain compression function of the MOS capacitor, have been previously illustrated and disclosed with reference to FIGS. 3a and 3b.

The cathode of photodiode 82 is connectable to an amplifier 100, shown in FIG. 5 as an N-Channel MOS transistor coupled as a source follower, through a transfer switch 102, shown in FIG. 5 as an N-Channel MOS transistor. The N-Channel MOS transistor forming transfer switch 102 has a first main terminal coupled to the cathode of photodiode 82 and a second main terminal coupled to the gate of the N-Channel MOS transistor forming the amplifier 100. The gate of the N-Channel MOS transistor forming the transfer switch 102 is driven by a XFR signal on Transfer line 104. As would be appreciated by persons of ordinary skill in the art, the drain of the source-follower N-Channel MOS transistor forming the amplifier 100 is coupled to Vcc at reference numeral 106. The capacitance of the node connecting transfer switch 102 to amplifier 100 stores the signal after the XFR signal on Transfer line 104 goes low.

The output of amplifier 100 is coupled to a Column line 108 through a Row-select switch 110, shown in FIG. 5 as an N-Channel MOS transistor. There is one Column line for each column in the array. The gate of the N-Channel MOS transistor forming the Row-select switch 110 is driven from a ROWSELECT signal on Row-select line 112. There is one Row-select line for each row in the array. The column line 108 may be reset to ground potential by a Column-reset switch 114, shown in FIG. 5 as an N-Channel MOS transistor having its source coupled to ground, its drain coupled to Column line 108, and its gate driven by a COLRESET signal on Column-reset line 116. An array of sensors of the present invention will include one column line 108 and one column line reset switch 114 and associated column reset line 116 per column of the array.

Figure 7:
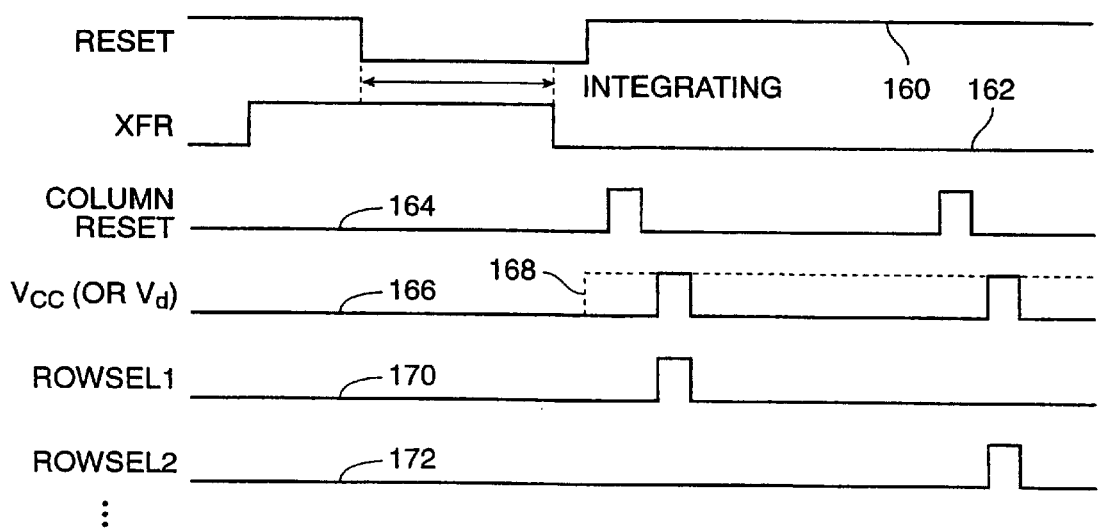
FIG. 7 is a timing diagram showing the timing of the signals used to operate the storage pixel sensors of FIGS. 5 and 6.

The timing of the RESET signal on line 90, the XFR signal on line 104, the ROWSEL signal on line 112, and the COLRESET signal on Column-reset line 116 will be disclosed in conjunction with FIG. 7. Alternatively, COLRESET 116 could be a fixed or variable bias voltage, and column-reset switch 114 could then be biased as a current-source load, as is commonly practiced in the art of active pixel sensor arrays.

Referring now to FIG. 6, a second embodiment of a storage pixel sensor 120 according to the present invention is depicted in a schematic diagram. As with the storage pixel sensor 80 of FIG. 5, storage pixel sensor 120 of FIG. 6 comprises a photodiode 122 having its anode coupled to a fixed voltage potential 124 (shown in FIG. 6 as ground). The cathode of photodiode 122 is coupled to a reference potential Vref 126 via a reset switch 128, shown in FIG. 6 as an N-Channel MOS transistor, so that the photodiode 122 is reverse biased. The gate of the N-Channel MOS transistor forming reset switch 128 is driven by a RESET line 130. The cathode of photodiode 122 is also connectable to a nonlinear capacitor 132, shown as an N-Channel MOS capacitor in FIG. 6, through a transfer switch 134, shown in FIG. 6 as an N-Channel MOS transistor. The gate of transfer switch 134 is driven by a XFR signal on transfer line 136. In this embodiment, the nonlinear capacitor is referred to as a storage capacitor, since it stores the pixel signal after the transfer switch is turned off.

As in the embodiment of FIG. 5, storage capacitor 132 is preferably a MOS capacitor and includes a first plate 138 comprising a substrate channel region with a diffusion terminal connectable to the cathode of photodiode 122 through transfer switch 134. A second plate 140 of nonlinear capacitor 132 comprises a polysilicon gate coupled to an adjustable voltage Vadj on line 142. As with the storage pixel sensor embodiment of FIG. 5, the Vadj potential for all of the pixels 120 in an array will be preferably coupled to a single adjustable voltage source capable of supplying a DC voltage between about 1 and 3 volts.

The first plate 138 of storage capacitor 132 is coupled to an amplifier 144, shown in FIG. 6 as an N-Channel MOS transistor coupled as a source follower. As would be appreciated by persons of ordinary skill in the art, the drain of the source-follower N-Channel MOS transistor forming the amplifier 144 is coupled to Vcc at line 146.

The output of amplifier 144 is coupled to a column line 148 through a select switch 150, shown in FIG. 6 as an N-Channel MOS transistor. The gate of the N-Channel MOS transistor forming the select switch 150 is driven by a ROWSEL signal on row-select line 152. As will be apparent to persons of ordinary skill in the art, in an array of storage pixel sensors of the type shown in FIG. 6, all pixels in a column of the array will be coupled to the column line associated with that column.

The column line 148 may be reset to ground potential by a Column-reset switch 154, shown in FIG. 6 as an N-Channel MOS transistor having its source coupled to ground, its drain coupled to Column line 148, and its gate driven by a COLRESET signal on Column-reset line 156.

Referring now to FIG. 7, a timing diagram shows the timing of the signals used to operate the storage pixel sensors of FIGS. 5 and 6. The topmost trace 160 is the RESET signal used to drive the reset switch of the storage pixel sensor. The RESET signal is active high and resets the pixel. RESET goes low during the integration period, defined by the period during which RESET is low and XFR signal 162 is high. The RESET and XFR signals 160 and 162 are global in an array.

After the XFR signal 162 has gone low to end the integration period as shown in FIG. 7, the COLRESET signal at reference numeral 164 goes high to globally reset all of the column lines in the array. The ROWSEL signals for the individual rows (two of which are depicted at reference numerals 170 and 172) are then asserted one at a time to transfer the pixel data from individual rows of the array to the column line outputs of the array. As shown in FIG. 7, the COLRESET signal is asserted prior to assertion of each ROWSEL signal. The timing relationship between the Vd signal and the ROWSEL1 and ROWSEL2 signals are not critical so long as there is sufficient overlap between their high levels.

In the embodiment of FIGS. 5 and 6, the signal Vd in FIG. 7 may be used in place of the fixed supply voltage on Vcc line 106. This arrangement provides additional compression in the storage pixel sensor and allows for operation of the pixel with compression having two break points in the photocharge-to-voltage compression ratio as will now be fully disclosed herein. Persons of ordinary skill in the art will understand that, if this feature of the present invention is not utilized, the DC voltage Vcc will be present on this line.

In the embodiments of FIGS. 5 and 6 of the present invention, the MOS varactor capacitors (92 and 132, respectively) and the Vadj lines (reference numerals 98 and 142, respectively) provide a mechanism for a first breakpoint photocharge-to-voltage gain compression in their respective pixels. A mechanism to provide a second breakpoint for the photocharge-to-voltage gain compression is the use of a pulsed signal Vd on the Vcc lines (reference numerals 106 and 146, respectively in FIGS. 5 and 6). Using a Vd signal on Vcc line 52 of FIG. 2 may also be advantageous, but it will not provide a second compression break point in that embodiment.

To use this aspect of the present invention, the Vcc line of the source follower amplifier of the pixel is held at a low state during integration. The source follower transistors in the pixel sensors of FIGS. 2, 5, and 6 are thus initially on. As the voltage at the gates of the transistors of these embodiments drop during the integration period, they eventually reach a level where the Vgs of the devices are below threshold, thus turning the devices off. The difference in capacitance between the depleted channels and the inverted channels is enough to provide a second photocharge-to-voltage gain-compression breakpoint. As will be appreciated by persons of ordinary skill in the art, the charge level at which the source follower transistor 100 or 144 will leave inversion and go into depletion depends on the low level voltage of the signal Vd, and the amount of photocharge required to get to that point depends on the initial reset potential Vref on line 86 or 126, so that the two break points are independently adjustable.

During integration, the large on-state capacitance at the gates of transistor 50 of FIG. 2 is coupled in parallel with, and therefore adds to, the photodiode capacitance and the MOS varactor capacitance. This increased capacitance decreases the photocharge-to-voltage gain during the integration period. However, this decrease in gain will usually be more than compensated by the increased readout gain that comes from the bootstrapping dynamics when the switched Vd power supply rail is brought high during the readout period as shown in trace 166 of FIG. 7.

Since raising Vd and letting the source terminal of transistor 50 settle upward causes the gate capacitance of transistor 50 to change from a high capacitance to a low capacitance, it will be appreciated that there will be a corresponding redistribution of charge and voltage values within the sensor circuit. Because the image charge signal can no longer be held on the gate of the source follower transistor, it is held instead on the parallel capacitances of photodiode and the MOS varactor. Since the net capacitance is lower, the photocharge-to-voltage gain is higher.

This bootstrapping action can be viewed as reducing the capacitance to get a higher voltage signal on the photodiode, and then reading out that signal through the usual gain of less than one of the follower transistor 50.

In the case of sensor 80 of FIG. 5, the effect of the bootstrap action is even more beneficial and surprising. After accumulating charge during an exposure interval, the transfer transistor 102 is turned off by the control signal XFR transitioning from high to low. When Vd (Vcc line 106) is subsequently raised to read out the signal, there is very little place for the image charge signal to be redistributed to. That is, the associated stray capacitance of the circuit node that includes the source/drain terminal of transistor 102 and the gate terminal of transistor 100 is quite small, compared to the capacitance of the photodiode and the MOS capacitor 92. This greatly reduced capacitance then leads to an increased charge-to-voltage gain. The limit on the achievable charge-to-voltage gain is then determined by the body effect, or back-gate effect, of the readout transistor 110. The resulting conversion is a nearly linear function of the charge signal that was captured on the storage node at the gate of transistor 100. This effect is also seen in the embodiment of FIG. 6, but the bootstrapping effect is smaller due to the presence of the MOS capacitor 132 on the storage-node side of the transfer switch 134.

The linear conversion of captured charge to a final voltage on the column output line of the sensor of FIG. 5 has two beneficial consequences. First, it means that a large capacitance value at the gate of the source follower transistor has a beneficial, rather than a harmful, effect on the overall gain, since a larger capacitance on that side of the transfer switch means that a larger fraction of the photocharge is captured, as opposed to being wasted charging the photodiode itself. The overall gain will typically exceed even the gain of the photodiode without any additional capacitive loading. Second, the linear conversion from captured charge to output voltage can lead to a beneficial compressive nonlinearity as follows: as photocharge is accumulated, the gate of the source follower transistor will fall in voltage until at some point it falls below the threshold voltage, at which point the gate capacitance will change from high to low. Further photocharge beyond this point will accumulate primarily on the photodiode and capacitor, so the voltage will fall more quickly. This photocharge-to-voltage breakpoint nonlinearity during integration is expansive, not compressive, but nonetheless leads surprisingly to a compressive break-point nonlinearity in the overall gain. When the transfer transistor 102 or 134 (FIGS. 5 or 6, respectively) is turned off, the proportion of charge stored on the storage side of the transfer switch is reduced at high light levels, since more of that charge is kept on the photodiode instead. Hence the integrated image signal voltage responds expansively during integration, yet a bootstrapped linear readout of the stored charge responds compressively.

Figure 8:
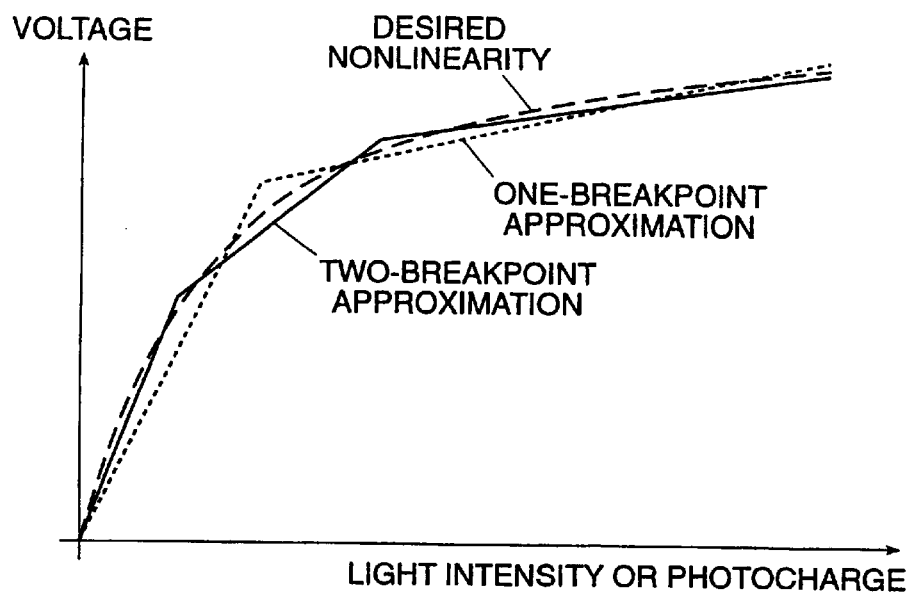
FIG. 8 is a plot containing three voltage vs. photocharge curves illustrating the advantage of the multiple-breakpoint photocharge-to-voltage compression feature of the present invention.

FIG. 8 is a plot showing the effect of the double-breakpoint photocharge-to-voltage compression that is achieved by the pixel sensor circuits of FIGS. 5 and 6 when operated with the signal Vd driving the drain of the source follower transistor amplifiers. The dashed trace in FIG. 8 shows the desired compressive nonlinearity according to a typical video gamma compression standard. The dotted trace shows the one-breakpoint approximation provided by the present invention, and the solid trace in FIG. 8 shows the two-breakpoint approximation.

As can be seen from an examination of FIG. 8, the use of two or more nonlinear MOS capacitors or other breakpoint nonlinear mechanisms provides three slopes |dV/dI| instead of two in the transfer curve, resulting in a greatly improved approximation to the desired nonlinearity.

Figure 9:
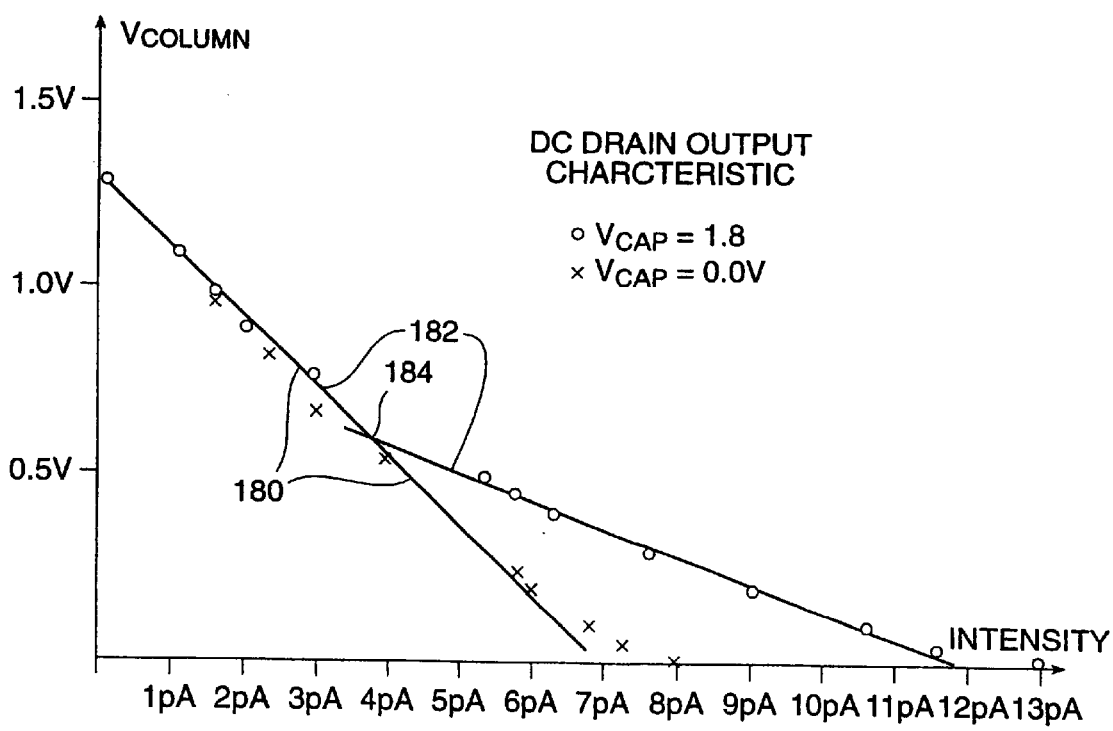
FIGS. 9 and 10 are a set of curves showing the nonlinear response of the present invention.

FIG. 9 is a plot of the column output voltage showing gain for two cases of the storage pixel sensor 80 of FIG. 5. The first case (trace 180) shows the output with the capacitor voltage Vadj=0, wherein the MOS capacitor is always in an off state. This trace shows no breakpoint. The second case (trace 182) shows the storage pixel sensor 80 of FIG. 5 with the capacitor voltage set at 1.8 volts. The trace shows a single breakpoint at reference numeral 184. Persons of ordinary skill in the art will appreciate that, in FIGS. 9 and 10, the voltage decreases with intensity due to the collected photocharges being negative electrons.

Figure 10:
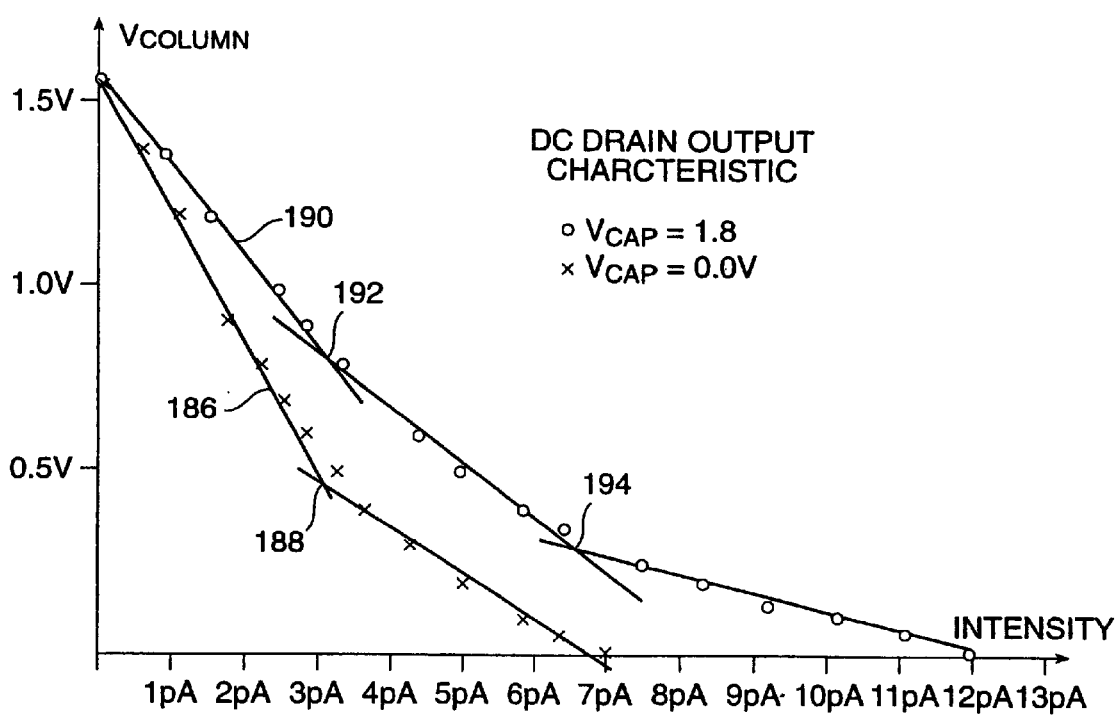

Like FIG. 9, FIG. 10. is a plot of the column output voltage showing gain for two cases of the storage pixel sensor 80 of FIG. 5. The first case of FIG. 10 (trace 186) shows the output with the capacitor voltage Vadj=0, wherein the MOS capacitor is always in an off state, with the drain voltage of transistor 110 of FIG. 5 pulsed. This trace shows a single breakpoint as a result of the pulsed drain voltage at reference numeral 188. The trace 190 shows the second case of the storage pixel sensor 80 of FIG. 5 with the capacitor voltage Vadj set at 1.8 volts. The trace 190 shows a double breakpoint, due to the combined action of the Vadj voltage (breakpoint at reference numeral 192) and the switched Vd and bootstrapping effect (breakpoint at reference numeral 194).

Referring now together to FIGS. 11a and 11b, respectively, top and cross-sectional views of a typical layout for the storage pixel sensor of FIG. 5 illustrate the photon and minority carrier shielding aspects of the present invention. Persons of ordinary skill in the art will recognize that the layout depicted in FIGS. 11a and 11b is illustrative only and other layouts are possible within the concepts of the present invention. In order to avoid overcomplicating the drawing figures, metal interconnect layers are omitted, and contacts are shown only in the top view of FIG. 11a.

The pixel sensor of the embodiment of FIGS. 11a and 11b of the present invention is preferably fabricated on a p-type substrate 200. Rectangular border 202 in FIG. 11a defines a well exclusion area where the p-well region 204 (seen best in FIG. 11b) is not present. All of the transistors in the storage pixel 80 of FIG. 5 are formed within the p-well 204.

The gate plate 96 of the storage capacitor 92 of FIG. 5 is formed from polysilicon region 206 and the channel plate of the storage capacitor comprises the region 208 of the substrate lying directly beneath polysilicon region 206. Contact is made to the Vadj node through electrical contact region 210.

The photodiode anode comprises the substrate 200 and the photodiode cathode comprises an n+ diffused region 212 in the substrate self-aligned to the polysilicon region 206. The source of the N-Channel MOS transistor forming the reset switch 88 of FIG. 5 is formed from region 214 of a first n+ diffusion finger extending to the right near the lower edge of photodiode cathode n+ diffusion 212. Polysilicon region 216 forms the gate of the reset switch, which is connected to the RESET metal line (not shown), via contact 218. The portion 220 of the n+ diffusion finger forms the drain of the reset switch, which is connected to the Vref metal line (not shown) by contact 222. It will be apparent to persons of ordinary skill in the art that the diffusion terminal of MOS capacitor 92 in FIG. 5 is the same as the photodiode cathode diffusion 212.

The N-Channel MOS transistor forming the transfer switch 102 of FIG. 5 is formed from n+ regions 224 and 226 of a second diffusion finger extending to the right near the center of the right edge of photodiode cathode n+ diffusion 212. Polysilicon region 228 forms the gate of the transfer switch, which is connected to the XFR metal line (not shown), via contact 230. The contact 232 and a metal line (not shown) connects the n+ diffused region 226 of the transfer switch to the polysilicon region 234 forming the gate of the source follower amplifier 100 of FIG. 5 via its contact 236. N+ diffused region 238 forms the drain of the source follower amplifier, which is connected to the Vcc (or Vd) metal line (not shown) through contact 240.

The n+ diffused region 242 forms the source of source follower amplifier 100 of FIG. 5, as well as the drain of row select switch 110 of FIG. 5. The source of row select switch 110 is formed from diffused region 244, which is connected to the column output metal line (not shown) through contact 246. Polysilicon line 248 forms the gate of row select switch 110. Persons of ordinary skill in the art will understand that polysilicon line 248 runs the entire length of a row in the array and that contact 250 is used to stitch polysilicon line 248 to a metal line (not shown) to reduce its resistance.

An important feature of the layout of the storage pixel sensor of the present invention is shown in FIGS. 11a and 11b. In a typical CMOS process the p-well mask is generated as a reverse field of the n-well mask. However since the p-well and n-well implants are masked separately for sub 0.5 um processes, there is no reason why the p-well and n-well must be complementary layers. According to this aspect of the present invention this fact is used advantageously. The p-well 204 is placed under all of the N-Channel MOS transistors in the pixel sensor. Elsewhere there is no p-well or n-well either, only the doping level of the starting wafer (about 1E15 p-type). Furthermore a metal region 252 forming a light shield extends out over the edges of the p-well 204. This means that photocurrent will only be generated outside the p-well 204 in the bulk substrate 200.

Since the p-well 204 is doped 100 times more heavily than the p-substrate 200 (10E17 vs. 10E15), there is a potential barrier for electrons to enter the p-well from the bulk of about 100 mV as shown diagrammatically at reference numerals 254. This will suppress collection of electron current by n+ diffusions inside the p-well by about 100 times (using the diode rule of thumb 62 mV/decade of current). Photocurrent generated outside the p-well will be preferentially collected by the n+ region of the photodiode (biased to Vref during the readout interval).

Referring now to FIGS. 12a and 12b, respectively, top and cross-sectional views of a typical layout for the storage pixel sensor of FIG. 6 further illustrate the photon and minority carrier shielding aspects of the present invention. In order to avoid overcomplicating the drawing figures, metal interconnect layers are not shown, and contacts are shown only in the top view of FIG. 12a.

Like the embodiment of FIGS. 11a and 11b, the pixel sensor of the embodiment of FIGS. 12a and 12b of the present invention is preferably fabricated on a p-type substrate 270. Rectangular border 272 in FIG. 12a defines a well exclusion area where the p-well region 274 (seen best in FIG. 12b) is not present. All of the transistors in the storage pixel sensor 120 of FIG. 6 are formed within the p-well 274.

The gate plate of the storage capacitor is formed from polysilicon region 278 and the channel plate of the storage capacitor comprises active region 276 of the substrate 270 lying directly beneath polysilicon region 278 in the rightmost portion of p-well 274. Contact is made to the Vadj node through electrical contact region 280.

The photodiode anode comprises the substrate 270 and the photodiode cathode comprises an n+ diffused region 282 in the substrate. The source of the N-Channel MOS transistor forming the reset switch 128 of FIG. 6 is formed from region 284 of a first n+ diffusion finger extending to the right near the lower edge of photodiode cathode diffusion 282. Polysilicon region 286 forms the gate of the reset switch and is connected to the RESET metal line (not shown) via contact 288. The portion 290 of the n+ diffusion finger forms the drain of the reset switch, which is connected to the Vref metal line (not shown) by contact 292. The N-Channel MOS transistor forming the transfer switch 134 of FIG. 6 is formed from regions 294 and 296 of a second n+ diffusion finger extending to the right near the center of the right edge of photodiode cathode diffusion 282. Polysilicon region 298 forms the gate of the transfer switch and is connected to the XFR metal line (not shown) via contact 300. The contact 302 and a metal line (not shown) connects the n+ diffused region 296 of the transfer switch to the polysilicon region 304 forming the gate of the source follower amplifier 144 of FIG. 6 via its contact 306. N+ diffused region 308 comprises the drain of the source follower amplifier, which is connected to the Vcc (or Vd) metal line (not shown) through contact 310.

The n+ diffused region 312 forms the source of source follower amplifier 144 of FIG. 6, as well as the drain of row select switch 150 of FIG. 6. The source of row select switch 150 is formed from diffused region 314, which is connected to the column output metal line (not shown) through contact 316. The portion of polysilicon line 318 that passes adjacent to diffused regions 312 and 314 forms the gate of row select switch 150. Persons of ordinary skill in the art will understand that polysilicon line 318 runs the entire length of a row in the array and that contact 320 is used to stitch polysilicon line 318 to a metal line (not shown) to reduce its resistance.

As with the embodiment discussed with reference to FIGS. 11a and 11b, an important feature of the layout of the storage pixel sensor of the present invention is that the p-well 274 is placed under all of the N-Channel MOS transistors in the pixel sensor. Elsewhere there is no p-well or n-well either, only the doping level of the starting wafer (about 1E15 p-type). Furthermore a metal region 321 comprising a light shield extends out over the edges of the p-well 274. This means that photocurrent will only be generated outside the p-well 274 in the bulk substrate 270.

Because the p-well 274 is doped 100 times more heavily than the p-substrate 270 (10E17 vs. 10E15), there is a potential barrier for electrons to enter the p-well from the bulk of about 100 mV as shown diagrammatically at reference numerals 322. This will suppress collection of electron current by n+ diffusions inside the p-well by about 100 times (using the diode rule of thumb 62 mV/decade of current). Photocurrent generated outside the p-well will be preferentially collected by the n+ region of the photodiode (biased to Vref during the readout interval).

Those of ordinary skill in the art will readily appreciate that the semiconductor structures described herein could be fabricated on an n-type substrate instead of a p-type substrate by reversing all p and n regions shown in FIGS. 11a, 11b, 12a, and 12b (in which case the photodiode terminal names anode and cathode would also be reversed). In addition, such skilled persons will realize that other type changes between p and n devices could be implemented without departing from the teachings of the invention.

Embodiments of the present invention employing two or more nonlinear mechanisms can be implemented by using devices of different types, different bias conditions, different capacitor positions relative to the transfer switches in storage pixels (as shown in the exemplary embodiments of FIGS. 5 and 6), or by using the stepped overflow barrier disclosed in co-pending application Ser. No. 09/031,333. From the two-breakpoint examples given in this disclosure, persons of ordinary skill in the art will readily be able to configure pixel sensors according to the present invention having three or more compression breakpoints.

Referring now to FIGS. 13 and 14a through 14e, the implementation of stepped-overflow-barrier compression may be easily seen. FIG. 13 is a simplified schematic diagram of a partial pixel sensor 350 connected to an n-type reset switch 352 serving the same role as transistor 88 in FIG. 5. The pixel sensor 350 of FIG. 13 includes a photodiode 354, having its anode formed in a semiconductor substrate (shown as ground symbol 356), and its cathode connected to the source of the reset transistor 352. The drain of the reset transistor 352 is connected to a reference voltage supply Vref (shown at reference numeral 358). The gate of the reset transistor 352 is connected to reset control line 360.

FIGS. 14a through 14e are energy diagrams that illustrate the potential at the photodiode cathode and the Vref supply in the circuit of FIG. 13. In each of FIGS. 14a through 14e, the substrate potential is shown at the left at reference numeral 370, the potential of the photodiode cathode is shown to its right at reference numeral 372. The potential barrier set by the reset transistor is shown to the right of the photodiode cathode at reference numeral 374. The potential of the Vref supply is shown furthest to the right at reference numeral 376. The reference numerals 370, 372, 374, and 376 will be followed by suffixes "a" through "e" to correspond to the figures to which reference is made.

The stippling and individual dots in each of the FIGS. 14a through 14e illustrate increments of charge. The height of the stippling in each region indicates the potential to which such charge has elevated each region. Those of ordinary skill in the art will recognize that charge units are electrons and thus will appreciate that higher levels of charge represent lower voltages.

FIG. 14a illustrates the potential energy conditions that exist during the reset period when transistor 352 is turned on to reset the pixel sensor 350 to Vref. At the point in time illustrated by FIG. 14a, the potential barrier presented by transistor 352 at reference numeral 374a is low and the energy level at the cathode of the photodiode 354 at region 372a is set equal to Vref by the flow of current through transistor 352. Thus the potential at the cathode of photodiode 354 at region 372a has been set equal to the level Vref which exists at reference numeral 376a.

FIG. 14b illustrates the potential energy conditions that exist during the early portion of the integration period when transistor 352 is turned off and photocharge is accumulating at the cathode of photodiode 354 in region 372b. The accumulation of photocharge starts to raise the energy at the cathode of photodiode 354 in region 372b because the potential barrier presented by the reset transistor 352 at reference numeral 374b prevents the photocharge from flowing through reset transistor 352. Note that the potential energy barrier presented by reset transistor 352 is lower than the potential of the substrate at reference numeral 370b.

FIG. 14c illustrates the potential energy conditions that exist during a later portion of the integration period. Transistor 352 is still off and photocharge has accumulated at the cathode of photodiode 354 in region 372c to raise the energy at the photodiode cathode. The potential barrier of the reset transistor 352 at reference numeral 374c still prevents the photocharge from flowing through reset transistor 352.

FIG. 14d, to which attention is now drawn, illustrates the potential energy conditions that exist during a later portion of the integration period. At this time, photocharge accumulating at the cathode of photodiode 354 in region 372d is overflowing the potential barrier of reset transistor 352 at reference numeral 374d, as shown by the stippling 378. Those of ordinary skill in the art will recognize that the overflow node is common to a group of pixels in an array. The group may include all pixels in the array. The condition of FIG. 14d will be reached by pixel sensors that are illuminated sufficiently to cause them to fill with charge to the overflow level. The condition will persist until the Reset barrier at transistor 352 is modified.

The energy conditions in FIG. 14d should be compared with those of FIG. 14e, in which the potential barrier (reference numeral 374e) of reset transistor 352 has been raised slightly to allow further exposure for a selected time period. This can be accomplished by a predetermined timer interval or through an automatic exposure control circuit such as the one of FIG. 5 of co-pending application Ser. No. 09/031,333, filed Feb. 26, 1998. During the brief period of continued exposure with a higher overflow barrier, bright pixels will integrate to different levels, corresponding to a low-gain region on the bright side of a breakpoint introduced by this stepped overflow barrier technique.

While embodiments and applications of this invention have been shown and described, it would be apparent to those skilled in the art that many more modifications than mentioned above are possible without departing from the inventive concepts disclosed herein. The invention, therefore, is not to be restricted except in the spirit of the appended claims.

What is claimed is:

1. A pixel sensor disposed on a semiconductor substrate comprising:

a MOS capacitive element having a gate terminal coupled to a voltage source and a diffusion terminal;

a photodiode having a first terminal coupled to a first potential and a second terminal coupled to said diffusion terminal of said MOS capacitive element;

a semiconductor reset switch having a first terminal coupled to said second terminal of the photodiode and a second terminal coupled to a reset potential that reverse biases said photodiode;

a semiconductor transfer switch having a first terminal coupled to said second terminal of said photodiode and a second terminal;

a semiconductor amplifier having an input coupled to said second terminal of said semiconductor transfer switch and an output;

said semiconductor reset switch and said semiconductor transfer switch each having a control element coupled to a control circuit for selectively activating said semiconductor reset switch and said semiconductor transfer switch.

2. The storage pixel sensor of claim 1 wherein said voltage source is adjustable.

3. The storage pixel sensor of claim 1 further including:

a light shield disposed over portions of the semiconductor substrate comprising said second terminal of the semiconductor transfer switch and said input of said semiconductor amplifier to prevent substantially all photons from entering thereon; and minority carrier rejection means for preventing substantially all minority carriers generated in the semiconductor substrate from entering said portions of said semiconductor substrate.

4. A storage pixel sensor disposed on a semiconductor substrate comprising:
   a MOS capacitive storage element having a gate terminal coupled to a voltage source and a diffusion terminal;
   a photodiode having a first terminal coupled to a first potential and a second terminal;
   a semiconductor reset switch having a first terminal coupled to said second terminal of the photodiode and a second terminal coupled to a reset potential that reverse biases said photodiode;
   a semiconductor transfer switch having a first terminal coupled to said second terminal of the photodiode and a second terminal coupled to said diffusion terminal of said MOS capacitive storage element;
   a semiconductor amplifier having an input coupled to said diffusion terminal of said MOS capacitive storage element and an output;
   said semiconductor reset switch and said semiconductor transfer switch each having a control element coupled to a control circuit for selectively activating said semiconductor reset switch and said semiconductor transfer switch.

5. The storage pixel sensor of claim 4 wherein said voltage source is adjustable.

6. The storage pixel sensor of claim 4 further including:
   a light shield disposed over portions of the semiconductor substrate comprising said second terminal of the semiconductor transfer switch, said diffusion terminal of said MOS capacitive storage element and said input of said semiconductor amplifier to prevent substantially all photons from entering thereon; and
   minority carrier rejection means for preventing substantially all minority carriers generated in the semiconductor substrate from entering said portions of said semiconductor substrate.

7. A pixel sensor comprising:
   a photosensor;
   at least one nonlinear capacitor element coupled to said photosensor;
   at least one nonlinear circuit element arranged to yield a compressive photocharge-to-voltage gain function coupled to said photosensor; and
   an amplifier having an input, said input coupled to said nonlinear capacitor element and to said at least one nonlinear circuit element, said amplifier also having an output.

8. The pixel sensor of claim 7 wherein said photosensor is a photodiode.

9. The pixel sensor of claim 7 wherein said at least one nonlinear capacitive storage element comprises a MOS capacitor including a first plate formed from a channel region in a semiconductor substrate coupled to said photosensor and a second plate formed from a gate coupled to a voltage source.

10. The pixel sensor of claim 7 wherein the compressive photocharge-to-voltage function is a single-break function.

11. The pixel sensor of claim 7 wherein the compressive photocharge-to-voltage function is a multiple-break function.

12. The pixel sensor of claim 11 wherein the compressive photocharge-to-voltage function is a double break function.

13. The pixel sensor of claim 7 wherein said nonlinear circuit element comprises an adjustable barrier.

14. A pixel sensor, formed on a semiconductor substrate, comprising:
   a photosensor, said photosensor comprises a photodiode having a first terminal and a second terminal;
   a nonlinear capacitive element arranged to have a compressive photocharge-to-voltage gain coupled to said photosensor, said nonlinear capacitive element comprises a MOS capacitor having a gate plate coupled to a voltage and a diffusion terminal coupled to the second terminal of said photodiode;
   a semiconductor reset switch having a first terminal coupled to said photosensor and a second terminal coupled to a reset potential, said first terminal of said semiconductor reset switch is coupled to said second terminal of the photodiode and said second terminal of said semiconductor reset switch is coupled to a reset potential that reverse biases said photodiode;
   a semiconductor amplifier having an input coupled to said photosensor and an output;
   said semiconductor reset switch having a control element coupled to a control circuit for selectively activating said semiconductor reset switch.

15. The photosensor of claim 14 wherein said semiconductor reset switch and said amplifier each comprise a MOS transistor.

16. A pixel sensor comprising:
   a photosensor;
   at least one nonlinear capacitor element coupled to said photosensor;
   an amplifier having an input, said input coupled to said nonlinear capacitor element, said amplifier also having an output, said amplifier comprises a MOS transistor having a gate and wherein said at least one nonlinear capacitor element comprises gate capacitance of said MOS transistor; and
   at least one nonlinear circuit element arranged to yield a compressive photocharge-to-voltage gain function coupled to said photosensor.

17. The pixel sensor of claim 16 wherein said at least one nonlinear circuit element comprises said MOS transistor coupled as a source follower having a drain coupled to a source of pulsed potential.

18. A pixel sensor comprising:
   a photosensor;
   at least one nonlinear circuit element arranged to yield a compressive photocharge-to-voltage gain function coupled to said photosensor;
   an amplifier having an input, said input coupled to at least one nonlinear capacitor element and to said at least one nonlinear circuit element, said amplifier also having an output;
   a first one of said at least one nonlinear circuit elements comprises said amplifier implemented as a MOS transistor coupled as a source follower having a drain coupled to a source of pulsed potential; and
   a second one of said at least one nonlinear circuit elements comprises an adjustable barrier.

* * * * *